United States Patent
Racanelli

(10) Patent No.: US 6,486,532 B1
(45) Date of Patent: Nov. 26, 2002

(54) STRUCTURE FOR REDUCTION OF BASE AND EMITTER RESISTANCE AND RELATED METHOD

(75) Inventor: Marco Racanelli, Orange, CA (US)

(73) Assignee: Newport Fab, LLC, Newport Beach, CA (US)

( * ) Notice: Subject to any disclaimer, the term of this patent is extended or adjusted under 35 U.S.C. 154(b) by 199 days.

(21) Appl. No.: 09/677,707

(22) Filed: Sep. 30, 2000

(51) Int. Cl.$^7$ .......................... H01L 29/00; H01L 29/94

(52) U.S. Cl. ...................... 257/571; 257/572; 257/565

(58) Field of Search ............................... 257/571, 572, 257/565

(56) References Cited

U.S. PATENT DOCUMENTS

| | | | |
|---|---|---|---|
| 5,430,317 A | * | 7/1995 | Onai et al. |
| 5,581,115 A | * | 12/1996 | Grubisich et al. |
| 5,589,409 A | * | 12/1996 | Bulucea et al. |
| 6,221,783 B1 | * | 4/2001 | Park et al. |
| 6,225,674 B1 | * | 5/2001 | Lim et al. |
| 6,410,975 B1 | * | 6/2002 | Racanelli |
| 6,436,818 B1 | * | 8/2002 | Hu et al. |

FOREIGN PATENT DOCUMENTS

DE          4240205     *  2/1992

* cited by examiner

Primary Examiner—Stephen D. Meier
(74) Attorney, Agent, or Firm—Farjami & Farjami LLP

(57) ABSTRACT

According to one embodiment, a semiconductor device including a base, an emitter, and an emitter contact on top of the emitter is disclosed. For example, the semiconductor device can be a silicon-germanium heterojunction bipolar transistor, in which the base is formed from epitaxially deposited silicon-germanium, the emitter is formed from polycrystalline silicon, and the emitter contact is formed as a borderless contact on top of the emitter. The base includes a link base region, an extrinsic base region, and an intrinsic base region. For example, the intrinsic base region can be the region of the base in which the base-emitter junction is formed by out-diffusion of dopants from the emitter. The extrinsic base can be a low resistance region formed by implantation doping to provide a low resistance electrical path from a base contact to the intrinsic base region through the extrinsic base and link base regions. A disclosed structure also includes a link spacer. For example, the link spacer can be composed of silicon nitride. The link spacer can be formed by conformal deposition of dielectric material over the emitter followed by an etch back. The link spacer determines the length of the link base region situated directly below the link spacer and between the intrinsic and extrinsic base regions. The link spacer dielectric also provides electrical isolation for the base and emitter, allowing the use of a low resistance borderless emitter contact directly on top of the emitter.

19 Claims, 5 Drawing Sheets

STRUCTURE FOR REDUCTION OF BASE AND EMITTER RESISTANCE AND RELATED METHOD

BACKGROUND OF THE INVENTION

1. Field of the Invention

The present invention relates to the field of fabrication of semiconductor devices. More specifically, the invention relates to the fabrication of silicon-germanium semiconductor devices.

2. Background Art

In a heterojunction bipolar transistor, or HBT, a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. Silicon-germanium may be epitaxially grown, however, on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

Because the benefits of a high gain and high speed silicon-germanium HBT device can be either partially or completely negated by high base and emitter contact resistance, it is important that the resistance of the base and emitter contacts be kept low. In addition to the contact resistances, the geometry of the base and emitter regions may also affect the base and emitter resistance. For example, contact to the emitter has previously been made in a manner known in the art by designing an emitter which is "routed out" and whose width is increased to provide a satisfactory area in which to form an emitter contact. The geometry of the base region may necessitate providing a low resistance electrical pathway through a portion of the base itself between the base contact and the base-emitter junction. In order to provide lower resistance from the base contact to the base-emitter junction, the extrinsic base region is heavily doped by implantation (also called extrinsic doping). The heavily doped extrinsic base region has a reduced resistance.

The region in the base between the edge of the heavily doped extrinsic base region and the edge of the base-emitter junction is referred to as the link base region. The link base region adds a significant amount of resistance between the base contact and the base-emitter junction. It is, therefore, important for the reasons stated above that resistance of the link base region also be kept low. The resistance of the link base region is affected by the length of the link base region from the heavily doped extrinsic base region to the edge of the base-emitter junction. Since the base-emitter junction is substantially coterminous with an "intrinsic base region," the link base region spans a distance between the intrinsic base region and the extrinsic base region. In other words, the link base region "links" the extrinsic base region to the intrinsic base region.

The length of the link base region spanning from the heavily doped extrinsic base region to the intrinsic base region must be no smaller than a certain minimum separation distance in order to provide separation between the heavily doped region of the extrinsic base and the heavily doped region of the emitter near the base-emitter junction. The link base region itself is relatively lightly doped. If the separation between the heavily doped region of the extrinsic base and the heavily doped region of the emitter near the base-emitter junction is not greater than a minimum separation distance, the two heavily doped regions can form a high electric field junction and increase the leakage current between the emitter and the base, thereby degrading the performance characteristics of the HBT device.

Depending on the alignment of the sequence of steps in the fabrication process used to form the link base region, the intrinsic base region, the base-emitter junction, and to implant the heavily doped extrinsic base region, the distance across the link base region to the intrinsic base region can vary, often unpredictably. The distance across the link base region to the intrinsic base region is also referred to as the length of the link base region in the present application.

With perfect alignment of the sequence of steps in the fabrication process, the distance across the link base region can be minimized to the minimum separation distance just discussed. In that case, the link base resistance would also be minimized. In a fabrication process which uses two separate photomasks, for example, to form the link base region, the intrinsic base region, the base-emitter junction, and to implant the heavily doped extrinsic base region, there is always a margin of error in the alignment of the two photomask steps. Accounting for the misalignment of the two photomask steps in the fabrication process forces the fabrication of a much greater distance across the link base region than the minimum separation distance. Thus, the link base resistance is greater than the minimum possible link base resistance.

It is important to provide low resistances in the base and emitter contacts, the heavily doped extrinsic base region, and the link base region in order to improve the performance and operating characteristics of the HBT or other similar device such as a conventional bipolar transistor. Because the resistances of the base contact, the heavily doped extrinsic base region, and the link base region are in series, the reduction of any one of them will provide an improvement in the resistance of the conduction path from the base contact to the intrinsic base region of the HBT or base of other similar device. Moreover, high resistance of the long "routed out" emitter is not satisfactory for application to the HBT; it is desirable to contact the emitter directly from the top of the emitter.

Thus, there is need in the art to reduce the link base resistance while maintaining low emitter contact resistance. There is further need in the art to reduce the link base resistance by providing a fabrication process which does not rely on the alignment of separate photomasks to form the link base region, the intrinsic base region, the base-emitter junction, and to implant the heavily doped extrinsic base region. There is also need in the art for fabrication of a low link base resistance structure which allows contact to the emitter directly on the top of the emitter.

SUMMARY OF THE INVENTION

The present invention is directed to structure for reduction of base and emitter resistance and related method. The invention overcomes the need in the art to reduce the link base resistance while maintaining low emitter contact resistance in semiconductor devices.

In one embodiment, the invention provides a method for fabrication of a low link base resistance structure which allows contact to the emitter directly on the top of the emitter. The invention reduces link base resistance by a fabrication process which does not rely on the alignment of separate photomasks to form the link base region, the intrinsic base region, the base-emitter junction, and to implant the heavily doped extrinsic base region.

According to the invention the structure of a semiconductor device includes a base, an emitter, and an emitter contact on top of the emitter. For example, the semiconductor device can be a silicon-germanium heterojunction bipolar transistor, in which the base is formed from epitaxially deposited silicon-germanium, the emitter is formed from polycrystalline silicon, and the emitter contact is formed as a borderless contact on top of the emitter. The base includes a link base region, an extrinsic base region, and an intrinsic base region. For example, the intrinsic base region can be the region of the base in which the base-emitter junction is formed by out-diffusion of dopants from the emitter. The extrinsic base can be a low resistance region formed by implantation doping to provide a low resistance electrical path from a base contact to the intrinsic base region through the extrinsic base and link base regions.

The structure of the invention also includes a link spacer. For example, the link spacer can be composed of silicon nitride. The link spacer can be formed by conformal deposition of dielectric material over the emitter followed by an etch back. The link spacer determines the length of the link base region situated directly below the link spacer and between the intrinsic and extrinsic base regions. The link spacer dielectric also provides electrical isolation for the base and emitter, allowing the use of a low resistance borderless emitter contact directly on top of the emitter.

Moreover, the invention provides a method for fabricating a structure of low link base resistance with emitter contact directly on the top of the emitter using only a single photomask to form the link spacer, the link base region, the intrinsic base region, the base-emitter junction, and to implant the heavily doped extrinsic base region. Thus, the fabrication process of the invention does not rely on the alignment of separate photomasks.

DETAILED DESCRIPTION OF THE INVENTION

The present invention is directed to structure for reduction of base and emitter resistance and related method. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
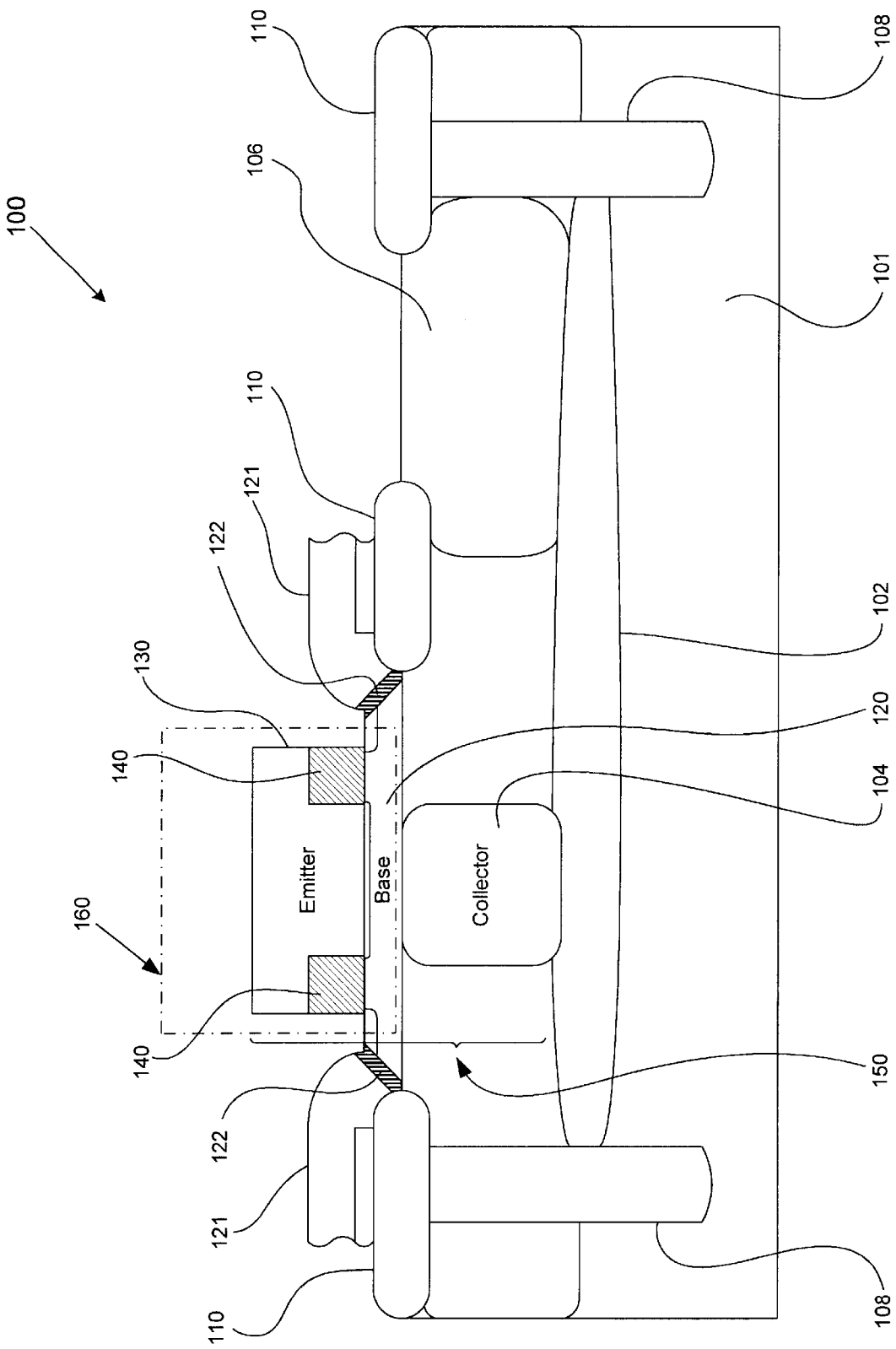
FIG. 1 illustrates a cross sectional view of some of the features of an NPN HBT.

By way of background, FIG. 1 shows a cross sectional view of various features and components of structure 100 which includes various features and components of an NPN heterojunction bipolar transistor ("HBT"). Structure 100 includes collector 104, base 120, and emitter 130. Collector 104 is N-type single crystal silicon which can be deposited epitaxially using an RPCVD process in a manner known in the art. Base 120 is P-type silicon-germanium single crystal deposited epitaxially in a "nonselective" RPCVD process according to one embodiment of the invention. As seen in FIG. 1, base 120 is situated on top of, and forms a junction with, collector 104. Base contacts 121 are polycrystalline silicon-germanium deposited epitaxially in a "nonselective" RPCVD process according to one embodiment of the invention. Base 120 and base contacts 121 connect with each other at interfaces 122 between the contact polycrystalline material and the base single crystal material. Emitter 130, which is situated above and forms a junction with base 120, is comprised of N-type polycrystalline silicon. Collector 104, base 120, and emitter 130 thus form a heterojunction bipolar transistor ("HBT") which is generally referred to by numeral 150 in FIG. 1.

As seen in FIG. 1, buried layer 102, which is composed of N+ type material—meaning that it is relatively heavily doped N-type material—is formed in silicon substrate 101 in a manner known in the art. Collector sinker 106, also composed of N+ type material, is formed by diffusion of heavily concentrated dopants from the surface of collector sinker 106 down to buried layer 102. Buried layer 102, along with collector sinker 106, provide a low resistance electrical pathway from collector 104 through buried layer 102 and collector sinker 106 to a collector contact (the collector contact is not shown in any of the Figures). Deep trench 108 and field oxide 110 isolation structures composed of silicon oxide ($SiO_2$) material are formed in a manner known in the art. Deep trench 108 and field oxide 110 isolation structures provide electrical isolation from other devices on silicon substrate 101 in a manner known in the art. Dielectric segments 140, which can be composed of silicon oxide, provide electrical isolation to emitter 130 from base 120. The region enclosed by dashed line 160 corresponds to structure 260 of FIG. 2, which shows the area enclosed by dashed line 160 in greater detail.

Figure 2:
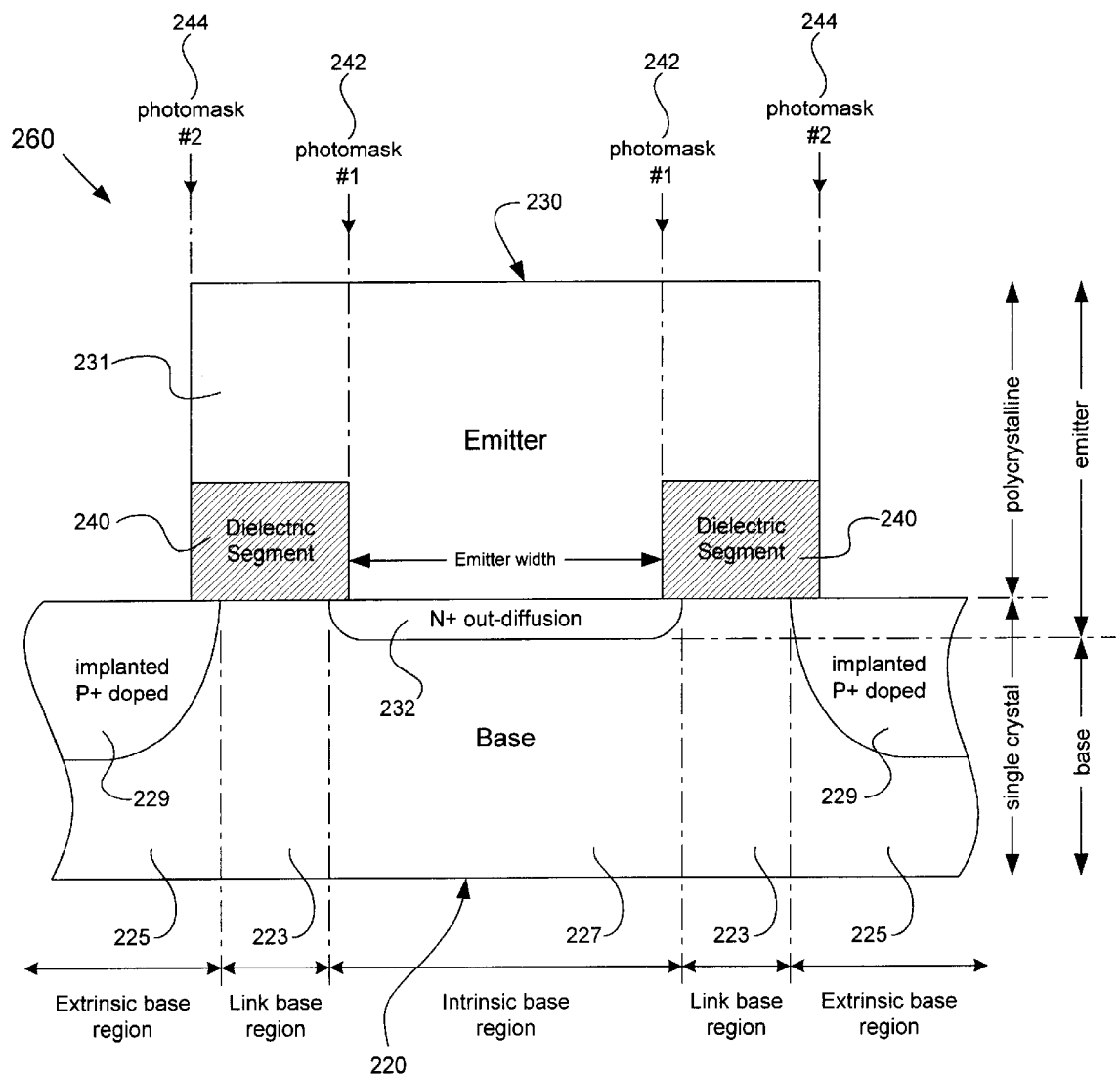
FIG. 2 illustrates in greater detail a portion of the cross sectional view of FIG. 1, and shows a cross sectional view of some of the features of an NPN HBT.

FIG. 2 shows a more detailed cross sectional view of selected features and components of structure 100 of FIG. 1. In particular, portions of emitter 130, base 120, and dielectric segment 140 enclosed by dashed line 160 in FIG. 1 are shown respectively as emitter 230, base 220, and dielectric segment 240 in structure 260 in FIG. 2. As FIG. 2 shows, emitter 230 comprises emitter polycrystalline silicon 231 and "out-diffusion region" 232 formed by the out-diffusion of N+ dopants from the emitter polycrystalline silicon 231 into the single crystal layer therebelow. As seen in FIG. 2, emitter polycrystalline silicon 231 is situated above N+ out-diffusion region 232.

Also as seen in FIG. 2, emitter polycrystalline silicon 231 substantially encapsulates dielectric segments 240. Dielectric segments 240 are situated above single crystal link base regions 223. In one embodiment, dielectric segments 240 can be silicon oxide. Single crystal N+ out-diffusion region 232 is situated above single crystal intrinsic base region 227. Extrinsic base regions 225, link base regions 223, and intrinsic base region 227 comprise base 220. The base-emitter junction is formed within the single crystal layer at the boundary of N+ out-diffusion area 232 and intrinsic base region 227.

Continuing with FIG. 2, N+ out-diffusion region 232 in the single crystal layer is formed by out-diffusion of heavy concentration of arsenic dopants after ion implantation doping of emitter polycrystalline silicon 231. The N+ doping renders emitter 230 an N-type emitter. Ion implantation of extrinsic base regions 225 has resulted in the heavily doped P+ implanted regions 229 within extrinsic base regions 225. In one embodiment, the dopant used to form implanted regions 229 can be boron. The heavy doping in implanted regions 229 lowers the overall resistance of extrinsic base regions 225. The overall base resistance of HBT 150 is thereby improved by lowering the contribution of extrinsic base regions 225 to the series resistance of the path from the base contacts, through the heavily doped extrinsic base regions 225, and link base regions 223 to intrinsic base region 227.

Continuing with FIG. 2, the distance between the two dielectric segments 240, which is also the emitter width, is determined by a first photomask. This first photomask is called "photomask #1" in FIG. 2 and is referred to by numeral 242. The boundaries of extrinsic base regions 225 are determined by a subsequent photomask which must be aligned with the first photomask. This subsequent photomask is called "photomask #2" in FIG. 2 and is referred to by numeral 244. Misalignment of the two photomasks causes the dimensions of dielectric segments 240 and the distance across link base region 223 to vary in an unpredictable fashion. Because the misalignment is unpredictable, the distance across link base region 223 must be increased to account for the misalignment. Thus, link base resistance, which depends on the distance across link base region 223, is not minimized in the two-photomask process discussed above.

Figure 3:
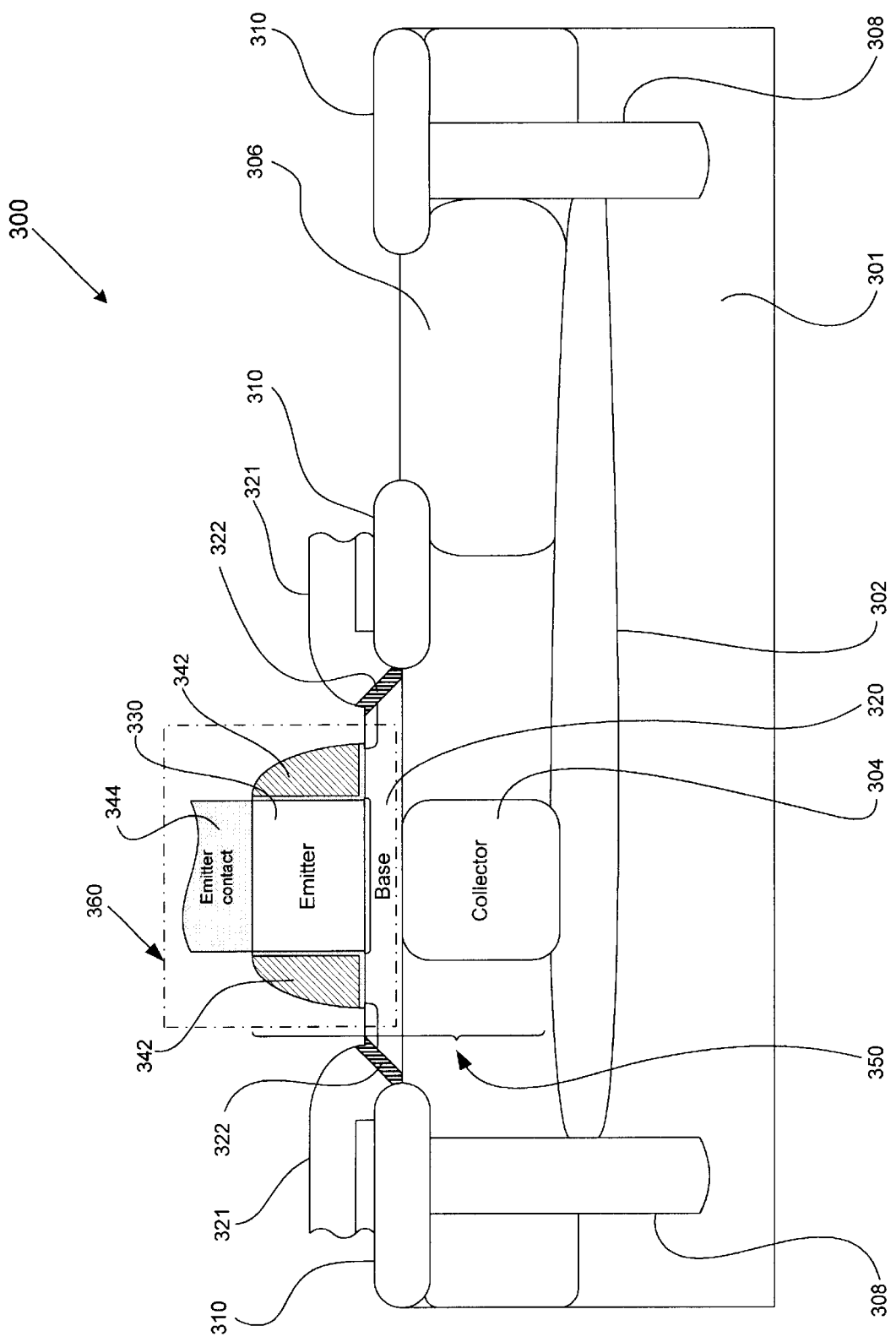
FIG. 3 illustrates a cross sectional view of some of the features of an NPN HBT fabricated in accordance with one embodiment of the present invention.

FIG. 3 shows a cross sectional view of various features and components of structure 300 which includes various features and components of an embodiment of the invention as described below. Certain details and features have been left out which are apparent to a person of ordinary skill in the art. Structure 300 includes features and components which are analogous in form and function to corresponding features and components of structure 100 in FIG. 1. The corresponding features and components are numbered in a manner consistent with FIG. 1, for example, collector 304 of structure 300 in FIG. 3 corresponds to collector 104 of structure 100 in FIG. 1. For the sake of brevity, the descriptions of the features and components of structure 300 analogous to those of structure 100 are not repeated. Structure 300 includes collector 304, base 320, emitter 330, base contacts 321, and interfaces 322 between th e base contact polycrystalline material and the base single crystal material. Structure 300 also includes buried layer 302 formed in silicon substrate 301 in a manner known in the art, collector sinker 306, deep trench 308 and field oxide 310 isolation structures. Collector 304, base 320, and emitter 330 thus form a heterojunction bipolar transistor ("HBT") which is generally referred to by numeral 350 in FIG. 3.

Continuing with FIG. 3, an embodiment of the invention utilizes link spacers 342, which can be composed of silicon nitride. The invention's link spacers 342 are described in more detail below in relation to FIG. 4. Emitter contact 344 is situated above emitter 330 and provides electrical connection to emitter 330. The region enclosed by dashed line 360 corresponds to structure 460 of FIG. 4, which shows the area enclosed by dashed line 360 in greater detail.

Figure 4:
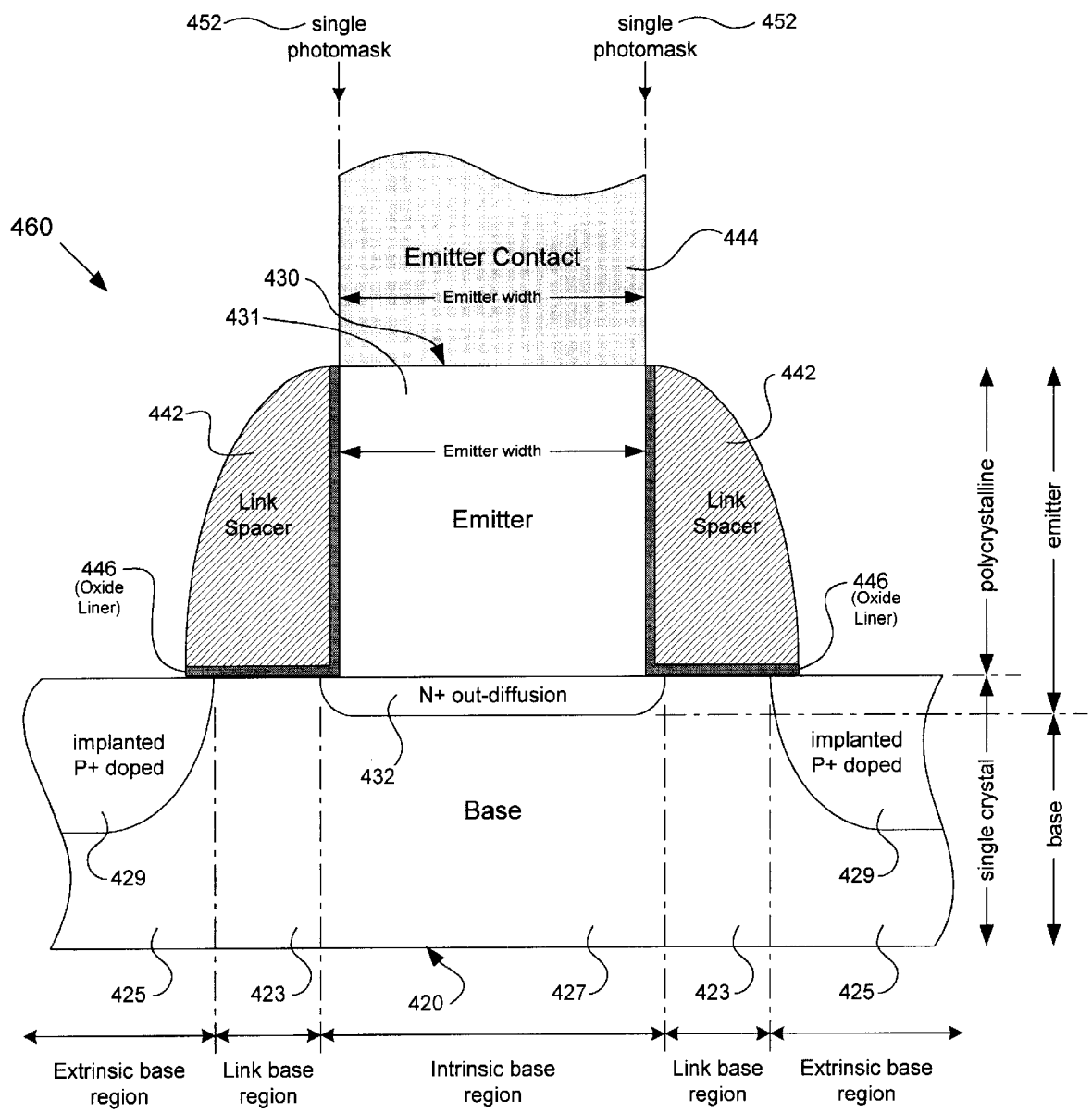
FIG. 4 illustrates in greater detail a portion of the cross sectional view of FIG. 3, and shows a cross sectional view of some of the features of an NPN HBT fabricated in accordance with one embodiment of the present invention.

FIG. 4 shows a more detailed cross sectional view of selected features and components of structure 300 of FIG. 3. In particular, portions of emitter 330, base 320, link spacers 342, and emitter contact 344 enclosed by dashed line 360 in FIG. 3 are shown respectively as emitter 430, base 420, link spacers 442, and emitter contact 444 in structure 460 in FIG. 4. As FIG. 4 shows, emitter 430 comprises emitter polycrystalline silicon 431 and "out-diffusion region" 432 formed by the out-diffusion of N+ dopants from the emitter polycrystalline silicon 431 into the single crystal layer therebelow. As seen in FIG. 4, emitter polycrystalline silicon 431 is situated above N+ out-diffusion region 432. Emitter contact 444 is situated above emitter polycrystalline silicon 431 and provides electrical connection to emitter 430.

Also as seen in FIG. 4, emitter polycrystalline silicon 431 is situated between link spacers 442. Link spacers 442 are situated above single crystal link base regions 423. In one embodiment, link spacers 442 can be silicon nitride. Single crystal N+ out-diffusion region 432 is situated above single crystal intrinsic base region 427. Extrinsic base regions 425, link base regions 423, and intrinsic base region 427 comprise base 420. The base-emitter junction is formed within the single crystal layer at the boundary of N+ out-diffusion region 432 and intrinsic base region 427.

Continuing with FIG. 4, N+ out-diffusion region 432 in the single crystal layer is formed by out-diffusion of heavy concentration of arsenic dopants after ion implantation doping of emitter polycrystalline silicon 431. The N+ doping renders emitter 430 an N-type emitter. Ion implantation of extrinsic base regions 425 has resulted in the heavily doped P+ implanted regions 429 within extrinsic base regions 425. In one embodiment, the dopant used to form implanted regions 429 can be boron. The heavy doping in implanted regions 429 lowers the overall resistance of extrinsic base regions 425. The overall base resistance is thereby improved by lowering the contribution of extrinsic base regions 425 to the series resistance of the path from the base contacts, through the heavily doped extrinsic base regions 425, and link base regions 423 to intrinsic base region 427.

Continuing with FIG. 4, according to the present invention, polycrystalline silicon emitter 431 is deposited over the general area of structure 460 and then patterned by using a single photomask. The width of polycrystalline silicon emitter 431 is thus determined by patterning the emitter using a single photomask referred to by numeral 452 in FIG. 4. After patterning the emitter, a conformal layer of oxide is deposited that forms oxide liner 446, for example by using a CVD process. Thereafter, a conformal layer of silicon nitride is deposited, for example by using a CVD process. Then an "etch back" is used to etch away all silicon nitride except the areas adjacent to the two sides of polycrystalline silicon emitter 431. These unetched areas are link spacers 442 shown in FIG. 4. Liner 446 has been provided to help control the etch back process. In one embodiment of the invention liner 446 can be silicon oxide. The edge position of link spacers 442, which also determines the boundaries of extrinsic base region 425, is determined by control of deposition thickness of the conformal silicon nitride layer prior to etch back.

Since a single photomask, instead of two photomasks are used, the span of each link base region 423 does not need to be increased to account for any misalignment between separate photomasks. Therefore, the span of each link base region 423 can be substantially minimized as discussed above. Thus, link base resistance, which depends on the length of link base region 423, is accurately controlled, predicted, and also substantially reduced.

Figure 5:
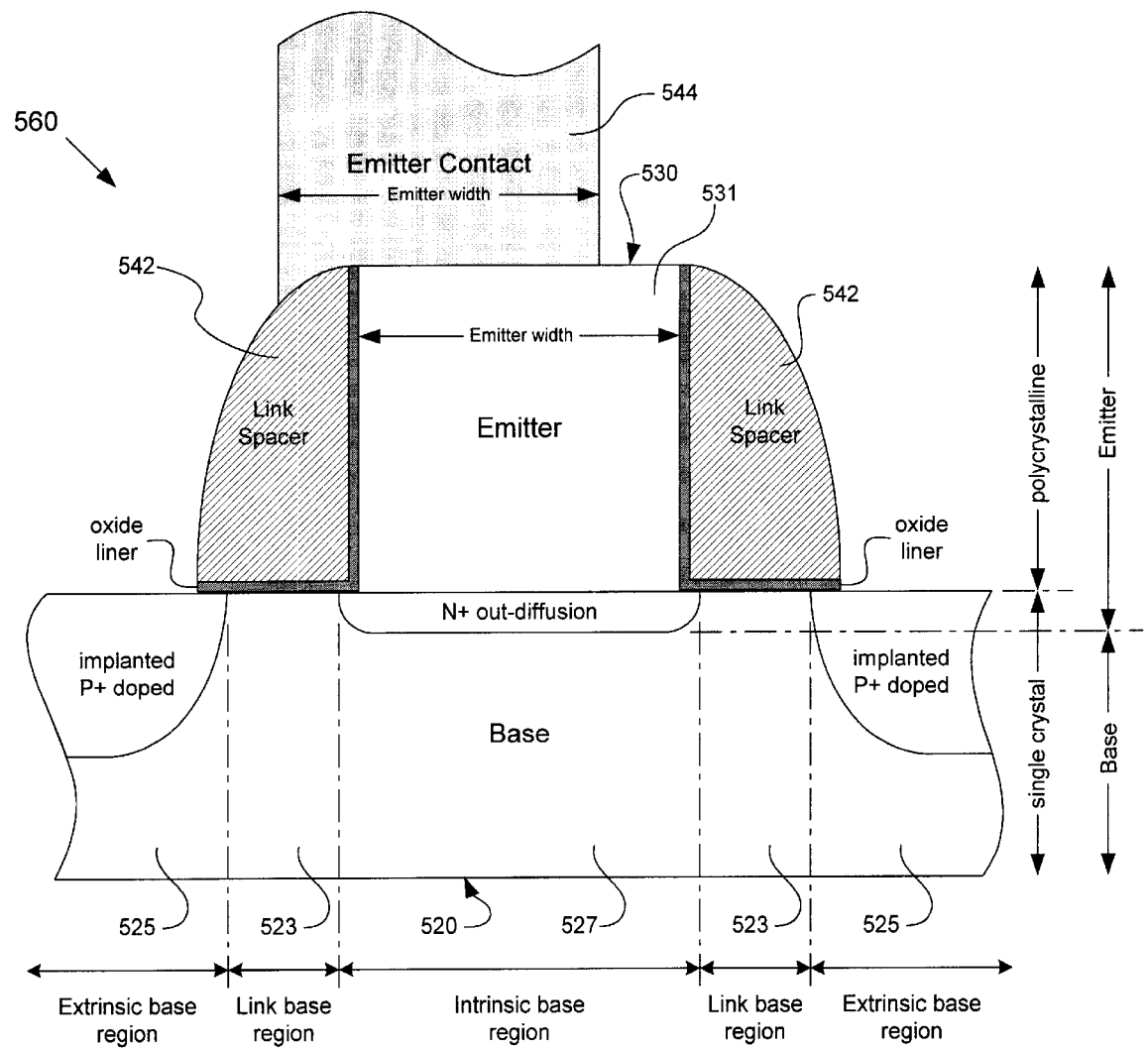
FIG. 5 illustrates a cross sectional view of a potential imperfect alignment of the emitter contact.

FIG. 5 shows a more detailed cross sectional view, similar to that of FIG. 4, of selected features and components of structure 300 of FIG. 3. In particular, portions of emitter 330, base 320, link spacers 342, and emitter contact 344 enclosed by dashed line 360 in FIG. 3 are shown respectively as emitter 530, base 520, link spacers 542, and emitter contact 544 in structure 560 in FIG. 5. As FIG. 5 further shows, silicon nitride link spacers 542 extend to substantially the full depth of emitter polycrystalline silicon 531 over most of the width of link base regions 523. Thus, in the case of imperfect alignment of emitter contact 544, as shown in FIG. 5, link spacers 542 provides electrical isolation to emitter contact 544 from extrinsic base regions 525, link base regions 523, the base-emitter junction, and intrinsic base region 527. Thus link spacers 542 enable the use of emitter contact 544 having full emitter width, and which can be formed as a "borderless contact" in a manner known in the art.

The width of link spacers 542 and, as a result, the width of link base regions 523 is proportional to the deposition thickness of the conformal silicon nitride. The typical error in control of deposition thickness of the silicon nitride conformal layer is on the order of approximately 100 to 200 Angstroms. In contrast, the typical error in alignment of separate photomasks is on the order of approximately 1000 Angstroms. Thus for one embodiment of the invention described here, the width control of link base region 523 can be improved by a factor of approximately 5 to 10. Improved width control requires a smaller "safety" distance to account for error, thereby allowing a decrease in the length of link base region 523.

Therefore, the resistance of link base region 523, which depends on the length of link base 523, is reduced. The lower resistance improves the overall base resistance of the HBT by lowering the contribution of link base regions 523 to the series resistance of the path from the base contacts, through the extrinsic base regions 525, and link base regions 523 to intrinsic base region 527. Moreover, a low emitter contact resistance is maintained because the formation of link spacers 542 allows the use of borderless contact technique to provide a full emitter-width contact 544. In other words, there is no longer a need to "route out" the emitter through a long distance to allow for proper contact formation. As such, the resistance associated with a long polycrystalline silicon emitter line is eliminated.

It is appreciated by the above detailed disclosure that the invention provides a method for reducing link base resistance while maintaining low emitter contact resistance. The method eliminates problems associated with alignment of separate photomasks by using only one photomask to form the link base regions, the intrinsic base regions, the base-emitter junction, and to implant the heavily doped extrinsic base regions. Using the invention, base resistance in an HBT can be controlled and improved while maintaining low emitter contact resistance. Although the invention is described as applied to the construction of a heterojunction bipolar transistor, it will be readily apparent to a person of ordinary skill in the art how to apply the invention in similar situations where control is needed to reduce base resistance while maintaining low emitter contact resistance.

From the above description of the invention it is manifest that various techniques can be used for implementing the concepts of the present invention without departing from its scope. For example, although the particular embodiment of the present invention described here is applied to silicon-germanium bipolar HBT device, the invention is also applicable, for example, to silicon or silicon-germanium bipolar or BiCMOS devices. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure for reduction of base and emitter resistance and related method have been described.

What is claimed is:

1. A structure comprising:
   an emitter;
   a link spacer adjacent to said emitter;
   a base including a link base region, an extrinsic base region, and an intrinsic base region;
   said link base region being situated below said link spacer, said link base region connecting said extrinsic base region to said intrinsic base region.

2. The structure of claim 1 wherein said emitter comprises polycrystalline silicon.

3. The structure of claim 1 wherein said link spacer comprises silicon nitride.

4. The structure of claim 1 wherein said base comprises single crystal silicon-germanium.

5. The structure of claim 1 wherein said intrinsic base region is situated below said emitter.

6. The structure of claim 1 wherein an emitter-base junction is formed within said intrinsic base region.

7. The structure of claim 1 wherein a width of said emitter is determined by a first photomask.

8. The structure of claim 7 wherein a length of said link base region is determined by a deposition thickness of said link spacer.

9. The structure of claim 7 wherein said link spacer is formed by etching back a conformal layer of a dielectric deposited over said emitter.

10. The structure of claim 9 wherein said dielectric comprises silicon nitride.

11. The structure of claim 9 wherein a length of said link base region is determined by a deposition thickness of said conformal layer.

12. A structure comprising:

an emitter having an emitter width;

a link spacer adjacent to said emitter;

a base including a link base region, an extrinsic base region, and an intrinsic base region;

said link base region being situated below said link spacer, said link base region connecting said extrinsic base region to said intrinsic base region;

a borderless contact situated on top of said emitter and said base, said borderless contact having a contact width substantially equal to said emitter width.

13. The structure of claim 12 wherein said emitter comprises polycrystalline silicon.

14. The structure of claim 12 wherein said base comprises single crystal silicon-germanium.

15. The structure of claim 12 wherein said emitter width is determined by a first photomask.

16. The structure of claim 15 wherein a length of said link base region is determined by a deposition thickness of said link spacer.

17. The structure of claim 15 wherein said link spacer is formed by etching back a conformal layer of a dielectric deposited over said emitter.

18. The structure of claim 17 wherein said dielectric comprises silicon nitride.

19. The structure of claim 17 wherein a length of said link base region is determined by a deposition thickness of said conformal layer.

* * * * *